United States Patent [19]
Wilcox

[11] 4,001,603
[45] Jan. 4, 1977

[54] EMITTER LOAD SWITCHING CIRCUIT

[75] Inventor: Milton E. Wilcox, San Jose, Calif.

[73] Assignee: National Semiconductor Corporation, Santa Clara, Calif.

[22] Filed: Feb. 25, 1976

[21] Appl. No.: 661,103

[52] U.S. Cl. .......................... 307/232; 307/299 A; 328/133; 328/155; 331/1 A; 331/25; 330/30 D

[51] Int. Cl.² .................. H03K 5/20; H03B 3/04

[58] Field of Search ................. 307/232, 299 A; 328/133, 134, 155, 145; 330/30 D; 331/1 A, 25

[56] References Cited

UNITED STATES PATENTS

| | | |
|---|---|---|
| 3,840,817 | 10/1974 | Seki .................................. 328/133 |
| 3,922,602 | 11/1975 | Lunquist ......................... 307/232 X |
| 3,961,360 | 6/1976 | Sato ................................ 328/133 X |
| 3,970,868 | 7/1976 | Clements et al. .................. 307/232 |

Primary Examiner—John S. Heyman
Attorney, Agent, or Firm—Gail W. Woodward

[57] ABSTRACT

In square wave signal processing, a plural signal combiner is provided with a reference input along with differential inputs for other signals to be combined. Each differential input terminal is provided with an emitter load by means of a plural emitter transistor connected to have a constant collector current. The combiner can process square wave signals to extract phase information.

10 Claims, 4 Drawing Figures

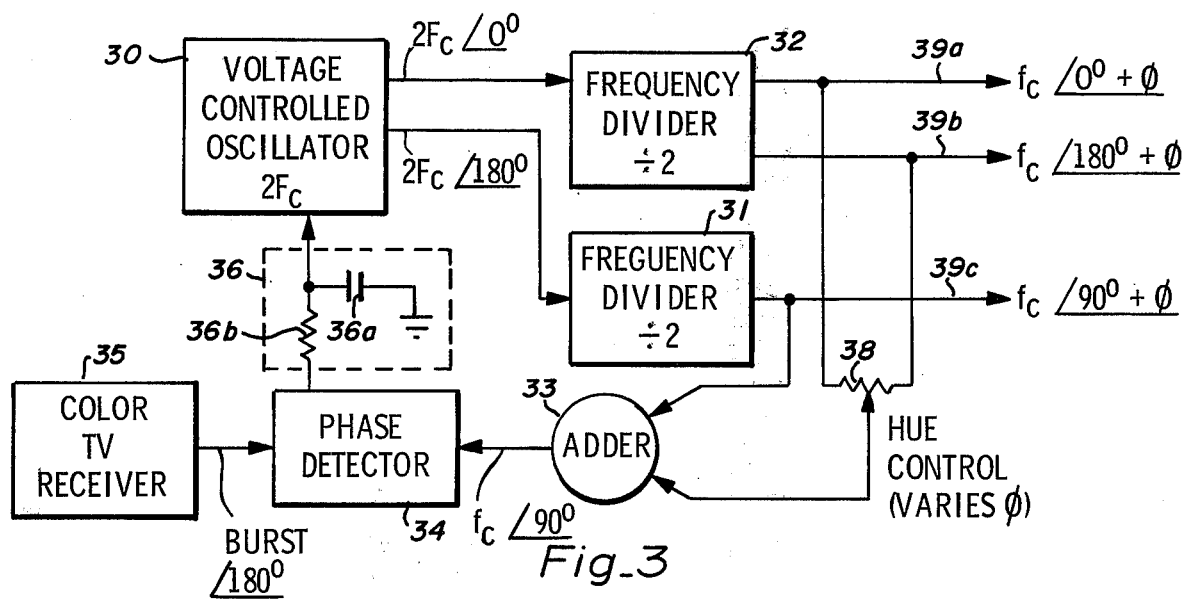
Fig_3
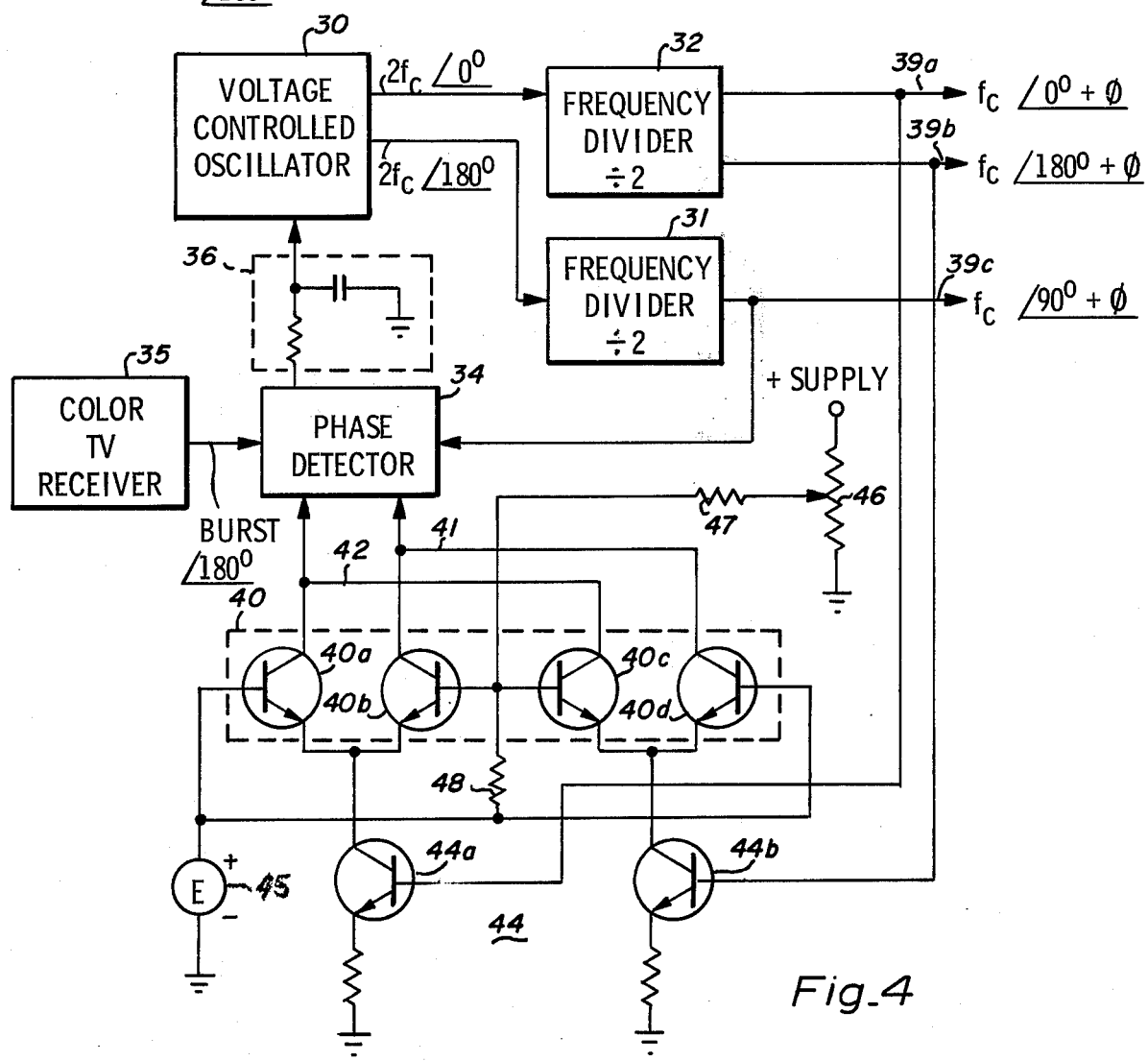
Fig_4

EMITTER LOAD SWITCHING CIRCUIT

BACKGROUND OF THE INVENTION

In electronic circuit practice it is often necessary to combine two signals of different phase to produce a resultant that has phase information directly related to the inputs. Typically two signals are added to produce an output signal that has a phase intermediate between the phases of the input signals, or the signals are applied to a detector which produces an output related to the difference in phase. When sine waves are employed as signals, conventional linear circuits can readily be employed for such signal processing. However, when the signals are square waves, such processing becomes confused, particularly when limiting is present and ordinary linear circuits cannot be used directly. Square wave signals are of great interest in microelectronic devices because great performance benefits have been realized by the use of digital circuitry.

Typically, where phase information is to be preserved in a square wave system the square wave is passed through a filter, which desirably converts the square wave into its fundamental sine wave equivalent. Then the signal combination is achieved conventionally and the resultant converted back into a square wave by means of amplification and signal limiting. This approach has the great disadvantage of requiring filter components that are difficult to achieve on a microelectronic circuit chip, thereby necessitating externally added components or extreme circuit complexity. Additionally, such filters are of restricted bandwidth. That is, they introduce signal phase shifts that increase with departure from design frequency.

SUMMARY OF THE INVENTION

It is an object of the invention to provide a circuit suitable for use in a microelectronic device that will permit combining square waves of different phases without resorting to frequency sensitive components.

It is a further object of the invention to make possible a square wave microelectronic signal processing circuit that is economical of semiconductor chip area yet avoids the use of external components and operates over a wide range of frequencies.

These and other objects are ahieved by the use of emitter load switching in a plural emitter transistor. Basically, a plural emitter transistor, having an emitter for each signal terminal, is connected to have a constant collector current. Each emitter is connected as a load element for an amplifier that is supplied with input signal information. When square wave signals are employed, the emitter loads are switched between two states which, in combination, represent a constant value. Ordinarily the off-on states are used with the on state values being controlled to be equal.

Typically two square wave signals of differing phase are fed to a demodulator. One signal is applied directly to the demodulator and the other signal is applied by way of a differential amplifier in paraphase. The differential signal terminals are provided with an emitter load device consisting of the emitters of a dual emitter transistor. The emitter voltage will be a logarithmic function of the current and the two emitter on currents are equal. Thus, as one load decreases in impedance the other load increases in nonlinear proportion. This action permits the square waves to be combined in a switching detector circuit without losing phase information and therefore without having to resort to signal filtering.

The above system can also employ to a quad circuit wherein further phase information can be inserted as a function of a d-c control value. This permits adjustment, by means of a d-c signal, to the phase difference between two square wave signals generated in response to the phase information available in the combiner. Such an arrangement is useful in, for example, the subcarrier regeneration circuits of a color television receiver.

BRIEF DESCRIPTION OF THE DRAWING

FIG. 3 is a block diagram of a color television subcarrier regenerator, and

FIG. 4 shows a color television subcarrier regenerator using emitter load switching and applied to a simplified schematic diagram of a quad circuit with d-c phase control.

DESCRIPTION OF THE INVENTION

Figure 1:
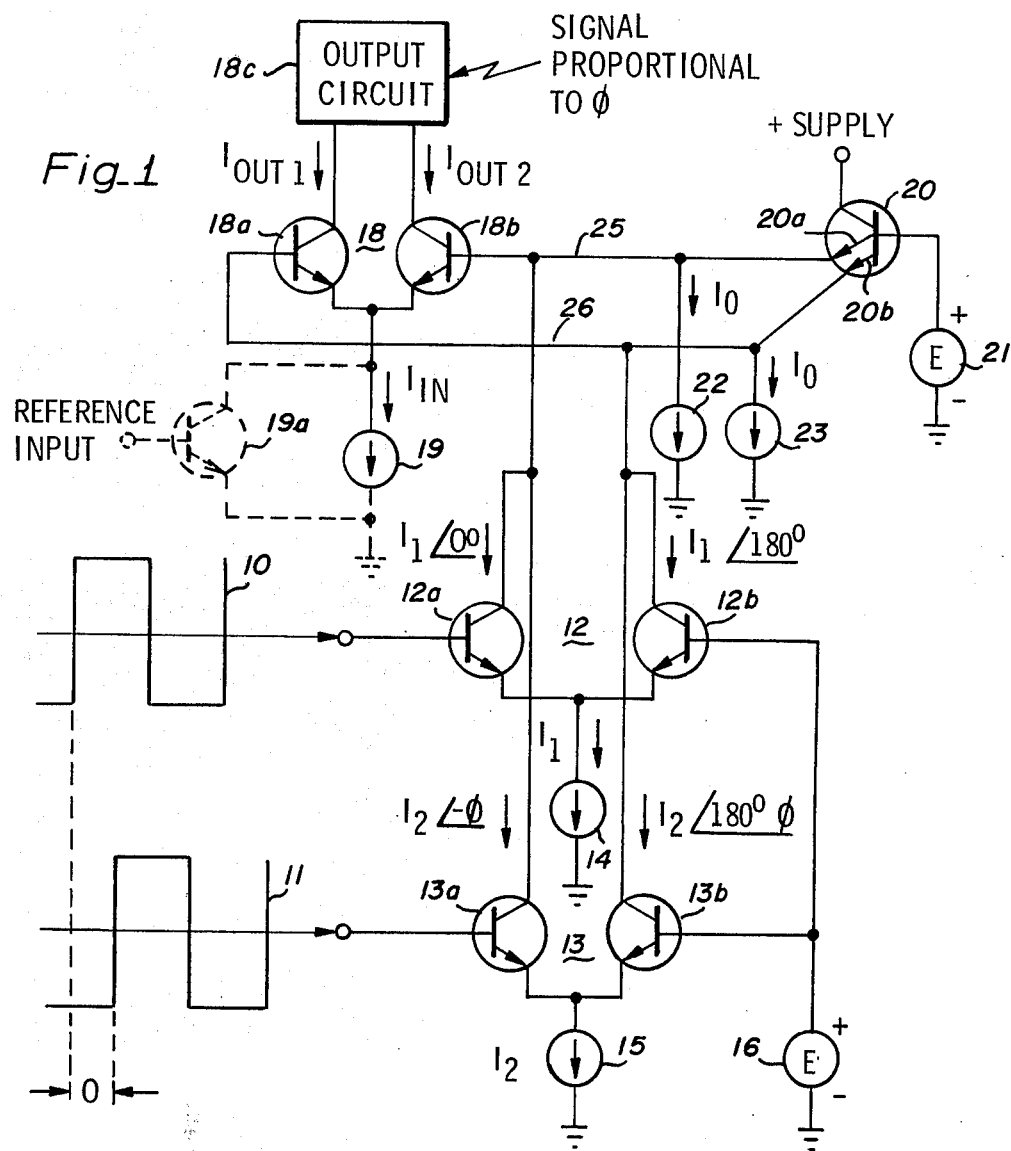
FIG. 1 is a simplified schematic diagram of an emitter load switching circuit for combining square waves of different phase.

FIG. 1 shows in simplified form a schematic diagram of a circuit for combining a pair of square waves of differing phase in a differential detector. The two square wave input signals 10 and 11 have a phase difference designated $\phi$. Each is applied to a differential amplifier, 12 and 13 respectively. These differential amplifiers each have a pair of transistors connected in the conventional manner. Each amplifier is supplied from a constant current source, 14 and 15, respectively, and each has its undriven input terminal connected to a source of constant voltage designated 16. The reference levels of the input signals are made equal to the d-c level of voltage source 16. Thus each side of the differential amplifiers contains equal out-of-phase signal components resulting from the input signals. Amplifier 12 is shown as the reference phase having signal current components $I_1/0°$ and $I_2/180°$. Amplifier 13 produces signal current components $I_2/-\phi$ and $I_2/180° -\phi$.

The differential amplifiers 12 and 13 have their outputs connected in paralled to drive differential detector 18. Detector 18 is shown with a current source 19 in the emitter circuit. This is done in order to simplify the following analysis. It is to be understood that typically detector 18 will be connected to the collector of transistor 19a which is shown in dashed outline. The base of transistor 19a will then be the source of a reference signal input. Thus, for the circuit shown three input signals could be accomodated. In practice where only two signals are to be combined, only one differential amplifier would be employed and the other input would be to the base of transistor 19a.

The output of detector 18 is load circuit 18c. This signal in load circuit 18c will contain information indicating the relative phase of the input signals as will be described hereinafter.

Emitter load device 20 is connected to the inputs for detector 18 and acts as a switched load for the differential drive signals present on lines 25 and 26. Two emitters 20a and 20b are shown in a single transistor 20 of conventional design. Constant voltage source 21 controls the base voltage of transistor 20 while equal value constant current sources, 22 and 23 establish the total emitter current flow. Voltage source 21 places the base of transistor 20 at a level above that established by source 16. If desired sources 21 and 16 can be series connected in a common circuit. Since the base of transistor 20 is connected to a constant voltage source 21 and the base to emitter potential of transistor 20 is a logarithmic function of the emitter current, it follows that voltages on lines 25 and 26 are a logrithmic function of the currents flowing in emitters 20a and 20b respectively of transistor 20. Since amplifiers 12 and 13 have differential outputs, as the voltage on line 25 rises, the voltage on line 26 falls. However, the logrithmic voltage response to current changes limits the voltage excursions on lines 25 and 26 so that transistors 18a and 18b in detector 18 are operated in a linear mode. Thus, when the square wave signals applied to the inputs are out of phase the detector output at 18c will contain information representative of the phase difference. Typically output circuit 18c will contain a flow pass filter and the output will be a d-c voltage (or current) proportional to $\phi$.

Since square waves are applied to the differential amplifiers it can be seen that the total emitter current will flow in one transistor at a time in the pair. That is, in the square wave mode each transistor is driven so as to be either on or off. This mode provides excellent circuit performance in the presence of noise and also requires a minimum of passive circuit elements.

Figure 2:
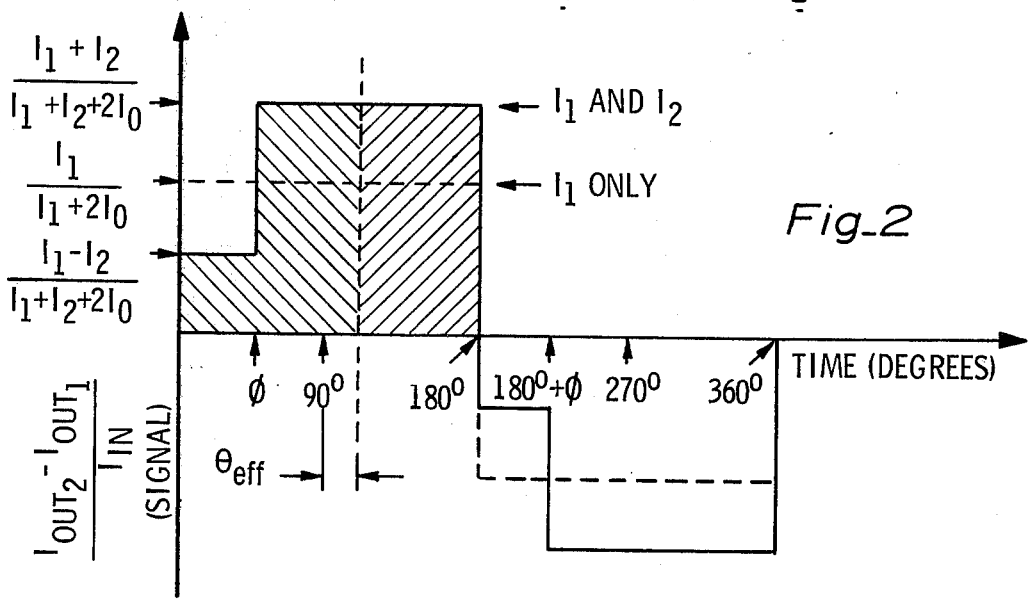
FIG. 2 shows the summed currents produced by two square wave inputs.

It can be seen that detector 18 responds only to the difference in voltage between the two emitters 20a and 20b of load 20. The detector response contains an exponential term related to its own base voltage and the emitter voltage response of load 20 contains a similar but opposite logrithmic response to signal drive current. This means that the non-linear components cancel and the detector circuit response becomes simply:

$$\frac{I_{OUT_1}}{I_{IN}} = \frac{I_{20a}}{I_{20a} + I_{20b}} \quad (1)$$

where:
$I_{OUT}$ is the signal at the collector of transistor 18a.
$I_{IN}$ is the signal at the emitter of detector 18.
$I_{20a}$ is the signal current in emitter 20a of load device 20 connected to line 25.
$I_{20b}$ is the signal current in emitter 20b of load device 20 connected to line 26.
The differential response is simply:

$$\frac{I_{OUT_1} - I_{OUT_2}}{I_{IN}} = \frac{I_{20a} - I_{20b}}{I_{20a} + I_{20b}} \quad (2)$$

where:
$I_{OUT}$ is the signal at the collector of transistor 18b.
FIG. 2 is a waveform graph showing the results of feeding two square wave signals to the circuit of FIG. 1 as shown. $\phi$ is the input signal phase difference. Since current sources 14 and 15 provide the signal current values, the vertical graph coordinate represent design values for $I_1$ in source 14 and $I_2$ in source 15. In the illustration $I_1$ is made larger than $I_2$ Since the input signal $I_1$ leads $I_2$ in the interval $0°$ to $\phi°$ amplifiers 12 and 13 are opposing states and the output is:

$$\text{Output} = \frac{I_1 - I_2}{I_1 + I_2 + 2I_0} \quad (3)$$

where:
$2I_o$ is the combined emitter source currents in transistor 20.

In the interval from $\phi°$ to $180°$, when both amplifiers are in the same state, the response is:

$$\text{Output} = \frac{I_1 + I_2}{I_1 + I_2 + 2I_0} \quad (4)$$

The remainder of the wave form is a mirror response of the first half. The dashed line shows the response to $I_1$ only for comparison. The above values are representative of a design choice for the current values and it is clear that other values can be selected.

Since the output of detector 18 is passed through a low pass filter the signal area will be averaged so that the area A1 equals area A2 as shown by the opposite hatching. The filtered average will have an effective phase center line that can, by inspection, be seen as shifted to the right of the 90° graph point. This phase shift is designated as $\theta_{eff}$, or the effective detector output phase. It can be seen that the output phase will be between the phases of the two input signals 10 and 11, and will be proportional to the magnitudes of the two currents $I_1$ and $I_2$. The graph shows that:

$$\theta_{eff} = \frac{I_2}{I_1 + I_2} \phi \quad (6)$$

For example, if $I_1$ and $I_2$ are made equal, the resultant phase would be 0.5 of the phase difference between the inputs. Thus if detector 18 were used for phase detection, the output would depend on the phase of the signal current in current source 19 and the resultant phase of the two square wave signals.

FIG. 3 is a block diagram showing a carrier regeneration circuit useful in a color television system. The so called "double frequency" system is shown because it too reduces circuit dependence on passive components and is readily applied to integrated circuits. The purpose of this circuit is to produce a continuous signal at the color subcarrier frequency for use in the color signal processing circuits. This signal must have the same frequency and be related to the phase of the intermittently transmitted reference called the color burst. A voltage controlled oscillator (VCO) 30 is shown operating at twice the frequency of the color subcarrier frequency, fc, that is to be regenerated. VCO 30 drives a pair of two-to-one frequency dividers 31 and 32, the outputs of which are at fc. The divider outputs are summed in resistive adder 33 and applied as a quadrature signal fc/90° to phase detector 34. The color carrier burst from receiver 35 is the other input to detector 34 and is shown as BURST/180°. In terms of FIG. 1, the BURST signal would be applied to transistor 19a and fc would be applied to either amplifier 12 or 13 and only the one amplifier used. The output of phase detector 34 is applied through low-pass filter 36 to VCO 30. This closed loop ensures that VCO 30 will be forced by detector 34 to operate at twice burst frequency and at a phase that will ensure a quadrature relationship between the inputs to detector 34. Here the charm of the twice frequency system becomes evident. In a two-to-one frequency division, the phase will also be divided by two. This means that if the two dividers are driven at 0° and 180° from the VCO, the outputs will be at 0° or reference phase on line 39a and 90° (180°÷2) on line 39c. Thus, a precise 90° phase shift can be achieved using no frequency sensitive components. The paraphase output of divider 32 on line 39b will represent the 180° signal at fc. All that is needed is for the VCO 30 to produce a symmetrical square wave and with integrated circuits this is easily achieved.

If only the output from divider 31, on line 39c, were fed to detector 34 the quadrature relationship with respect to the color burst would be maintained. However customer control of the color signals is desirable. For this reason hue control 38 is added. Hue control 38 is connected across the paraphase outputs of dividers 32, lines 39a and 39b. The variable arm is connected to adder 33 along with the output of divider 31. If hue control 38 is set to its midpoint, where there is no contribution from divider 32 to adder 33, the signals will retain the 90°, 0° and 180° relationship to the color burst as described above. However, if the control arm is moved away from its center position a phase shift will occur. This is designated as $\phi$ in FIG. 3. This incremental phase shift can be a positive or negative value relative to the phase of the signal fc/90° fed to detector 34. Thus, a simple non-reactive control element will continuously vary the phase of the regenerated color subcarrier signal over a fairly wide range. A ±45° shift can easily be achieved in practice.

If the circuit of the invention is integrated as element 34 into the circuit of FIG. 3, a fully integrated device can be achieved using digital devices and a minimum of external components. In practice the only external components would probably be the crystal (not shown) which is the heart of VCO 30, the capacitor 36a of low-pass filter 36, and the hue control 38.

FIG. 4 shows an alternative embodiment of the invention. The block diagram section elements are similar to elements in FIG. 3 and where applicable carry similar designation numbers. The adder is not present and the hue control circuit is different. In this embodiment it is desired to have a hue control that has no signal components at the control itself. The operation of FIG. 4 in regard to signal production and locking of the VCO 30 to the color burst from receiver 35 is as described above. The quadrature reference signal on line 39c is applied directly to phase detector 34.

A transistor quad 40, which employs four interconnected transistors, 40a through 40d, is used to modulate phase detector 34. Lines 41 and 42 of FIG. 4 would be connected to the circuit of FIG. 1 at lines 25 and 26. Thus, an additional control input is available to the phase detector. In terms of FIG. 1, quad 40 would replace one of the differential amplifiers 12 or 13, the burst would be fed to transistor 19a, and the output of divider 31 fed to the remaining differential amplifier 12 or 13 whichever one is not replaced by quad 40.

Quad 40 is driven in paraphase at reference phase from lines 39a and 39b through amplifier 44 comprised of transistors 44a and 44b. This amplifier, in which the transistor collectors supply a pair of modulated currents to quad 40, could if desired be connected as a differential pair. In quad 40 transistors 40a and 40d have their bases connected to a source of constant voltage 45. Transistors 40b and 40c have their bases connected to a source of variable voltage available from hue control 46. Resistors 47 and 48 complete the d-c circuit between source 45 and the arm of hue control 46. If the arm of hue control 46 is set at the voltage point equal to the voltage of source 45, quad 40 will be fully balanced and will contribute no signal to detector 34. For this condition the quadrature input from line 39c will lock the system in quadrature with the color burst signal. The reference signal on lines 39a and 39b will then be at 0° and 180° respectively. For this condition $\phi$ is zero.

If hue control 46 is moved in either direction from the above-described neutral point, quad 40 will no longer be balanced and some reference input will be applied to detector 34 along with the quadrature signal. This will add (or subtract) a phase shift in the system in the manner shown for FIG. 3 and $\phi$ can be given a positive or negative value as desired. However, in FIG. 4 the hue control operates with only direct current present. Thus, the hue control can be remotely located with respect to the microcircuit containing the active circuits with no regard for signal properties. In fact the arm of hue control 46 could be heavily bypassed for ac to preclude any signal pickup or parasitic interaction. Such a circuit configuration also lends itself to automatic control, wherein hue control 46 would be replaced or augmented with a d-c control amplifier as is well known in the art.

As was the case for the components associated with FIG. 3, FIG. 4 can readily be implemented in integrated circuit from using conventional digital elements. These elements can be achieved using very little chip area, with a minimum of external components, and without using reactive components. The result is a highly-stable low-cost wide-band microelectronic circuit.

The invention has been described and its use shown in two circuit embodiments. Clearly alternatives and equivalents will occur to a person skilled in the art. For example, while all transistors are of the NPN variety, PNP types or even field effect active devices could be used. Accordingly, it is intended that the scope of the invention be limited only by the following claims.

I claim:
1. A circuit for responding to a plurality of square waveform signals of differing phase to obtain a signal having phase information representative of the combined signals, said circuit comprising:
   means for accomodating a first signal input and a second signal input, each of said signal inputs being of approximately square wave form and having a particular phase,
   means for providing opposite polarity representations of at least one of said first and second input signals,
   means for processing said opposite polarity representations to derive an output that has information representative of the combined input signal phases, said means for processing having at least one output terminal and two input terminals, and
   load means coupled to said two input terminals of said means for processing said opposite polarity representations, said load means having a logarithmic voltage response as a function of current and a constant combined load response at said two input terminals.
2. The circuit of claim 1 wherein said load means comprises the emitters of a plural emitter transistor.
3. The circuit of claim 1 wherein said means for processing has its output coupled to low pass filter means wherein said differing phase of said square waveform signals is represented by a direct current magnitude that is passed by said filter means.

4. The circuit of claim 3 in combination with; voltage controlled oscillator means, said oscillator means being controlled by said direct current magnitude; a pair of frequency dividers driven in paraphase by said oscillator means; means for supplying the output of one of said pair of dividers to one of said signal input accomodating means, the other of said signal input accomodating means being supplied by means producing an intermittent signal having particular frequency and phase characteristics whereby said oscillator is phase locked to maintain a constant phase relationship between said intermittent signal and said output of said one of said dividers and the output of the other of said pair of frequency dividers represents a signal having the same phase as said intermittent signal.

5. The circuit of claim 4 wherein said oscillator operates at twice the frequency of said intermittent signal, said dividers divide by two, and said phase difference is about in quadrature.

6. The circuit of claim 5 further including means for combining variable proportions of the outputs of said pair of dividers for supplying said one of said signal input accomodating means, thereby varying the phase relationship between said intermittent signal and said divider output signals.

7. The circuit of claim 6 wherein said means for combining comprise an adder having at least two inputs, means for coupling the output of one of said dividers to one of said adder inputs, variable means coupled in paraphase to the output of the other of said dividers, and means for coupling the variable output of said variable means to the other of said adder inputs.

8. The circuit of claim 6 wherein said means for combining comprise a transistor quad, means for modulating said quad in paraphase with the signal output of the one of said dividers having its output in phase with said intermittent signal, means for coupling the output of said quad to said two input terminals of said means for processing and variable means coupled to said quad to vary the balance therein.

9. The circuit of claim 8 wherein said variable means comprise a potentiometer having a resistive body and a variable arm, said resistive body being coupled to a source of direct current, and said arm of said potentiometer being coupled to two of the transistors bases in said quad with the other two transistor bases in said quad being coupled to a source of constant potential.

10. A phase detector circuit for producing a variable direct current in an output circuit in response to the phase difference between first and second signals, which may be square wave signals, applied to first and second input terminals, said phase detector circuit including power supply connection means, means for supplying a plurality of currents and potentials, and comprising:
  a source of modulated current, said source including a transistor having an emitter, a base and a collector, said emitter being coupled to a supply terminal, said base being coupled to one of said input terminals, and said collector being coupled to supply a current modulated by one of said signals;
  a differential transistor detector pair, each detector transistor having emitter, base, and collector electrodes, means coupling said emitters in said detector pair together to said source of modulated current, means coupling said collectors in said detector pair to said output circuit;
  paraphase drive lines;
  means coupling said bases in said detector pair to said paraphase drive lines;
  a pair of paraphase driver transistors, each having an emitter, a collector and a base, means coupling said driver transistors collectors to said paraphase driver lines, means coupling said driver transistor emitters to a source of current, means coupling said bases of said driver transistors to signal input terminals; and
  a load transistor having a collector, a base, and a plurality of emitters, means coupling said collector of said load transistors to a supply terminal, means coupling said base of said load transistor to a second source of constant potential, and means coupling an emitter of said plurality of load transistor emitters to each of said paraphase drive lines.

* * * * *